(12) United States Patent
Reusch et al.

(10) Patent No.: US 10,601,300 B2
(45) Date of Patent: Mar. 24, 2020

(54) INTEGRATED GALLIUM NITRIDE BASED DC-DC CONVERTER

(71) Applicant: Efficient Power Conversion Corporation, El Segundo, CA (US)

(72) Inventors: David C. Reusch, Blacksburg, VA (US); Jianjun Cao, Torrance, CA (US); Alexander Lidow, Marina Del Rey, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 15/983,803

(22) Filed: May 18, 2018

(65) Prior Publication Data
US 2018/0337588 A1    Nov. 22, 2018

Related U.S. Application Data

(60) Provisional application No. 62/508,498, filed on May 19, 2017.

(51) Int. Cl.
| | |
|---|---|
| *H01L 27/12* | (2006.01) |
| *H02M 1/08* | (2006.01) |
| *H02M 3/335* | (2006.01) |
| *H02M 3/158* | (2006.01) |
| *H01L 29/786* | (2006.01) |
| *H02M 1/42* | (2007.01) |
| *H01L 29/20* | (2006.01) |
| *H01L 29/778* | (2006.01) |
| *H01L 29/40* | (2006.01) |

(52) U.S. Cl.
CPC .......... *H02M 1/08* (2013.01); *H01L 27/1203* (2013.01); *H01L 29/78681* (2013.01); *H02M 1/4225* (2013.01); *H02M 3/158* (2013.01); *H02M 3/33592* (2013.01); *H01L 29/2003* (2013.01); *H01L 29/402* (2013.01); *H01L 29/7786* (2013.01)

(58) Field of Classification Search
CPC ... H01L 23/528; H01L 27/02; H01L 27/1203; H01L 29/2003; H01L 2027/11805
See application file for complete search history.

(56) References Cited

U.S. PATENT DOCUMENTS

| | | |
|---|---|---|
| 7,202,538 B1 | 4/2007 | Hopper et al. |
| 7,230,302 B2 | 6/2007 | Lotfi et al. |
| 7,550,781 B2 | 6/2009 | Kinzer et al. |

(Continued)

OTHER PUBLICATIONS

H. Umeda, et al., "Highly Efficient Low-Voltage DC-DC Converter at 2-5 MHz with High Operating Current Using GaN Gate Injection Transistors," International Exhibition and Conference for Power Electronics, Intelligent Motion, Renewable Energy, and Energy Management (PCIM Europe), pp. 1025-1032, 2014.

(Continued)

*Primary Examiner* — Cuong Q Nguyen
(74) *Attorney, Agent, or Firm* — Blank Rome LLP

(57) ABSTRACT

An integrated DC-DC converter device includes a plurality of GaN transistor sets. A first set of the plurality of GaN transistor sets includes transistors with a first drain-to-source distance, and wherein a second of the plurality of GaN transistor sets includes transistors with a second drain-to-source distance that is greater than the first drain-to-source distance.

20 Claims, 12 Drawing Sheets

(56) References Cited

U.S. PATENT DOCUMENTS

| | | | |
|---|---|---|---|
| 8,063,616 B2 | 11/2011 | Bahramian et al. | |
| 9,299,691 B2 | 3/2016 | Lotfi et al. | |
| 9,401,612 B2 | 7/2016 | Kinzer et al. | |
| 9,871,063 B1* | 1/2018 | Oh | H01L 27/124 |
| 2010/0109015 A1* | 5/2010 | Ueno | H01L 29/2003 |
| | | | 257/76 |
| 2011/0241637 A1* | 10/2011 | Parker | H02J 9/061 |
| | | | 323/282 |
| 2014/0175453 A1* | 6/2014 | Yamada | H01L 27/0605 |
| | | | 257/76 |
| 2014/0225162 A1 | 8/2014 | Briere | |
| 2015/0162832 A1 | 6/2015 | Briere | |
| 2016/0116925 A1* | 4/2016 | Freeman | H02M 3/33546 |
| | | | 307/130 |
| 2018/0091055 A1* | 3/2018 | Childs | H02M 1/14 |

OTHER PUBLICATIONS

High Frequency GaN-Based Integrated Power Stage, iP2010PbF, http://www.irf.com/product-info/datasheets/data/ip2010pbf.pdf.
http://www.powerguru.org/enpirion-achieves-quantum-leap-in-micro-fabrication-and-materials-technology Dec. 6, 2012.
D. Reusch et al., "Improving High Frequency DC-DC Converter Performance with Monolithic Half Bridge GaN ICs," Energy Conversion Congress and Exposition (ECCE), Sep. 2015, pp. 381-387.
S. Ji et al., "High Frequency High Power Density 3D Integrated Gallium Nitride-Based Point of Load Module Design," IEEE Transactions on Power Electronics, Sep. 2013, pp. 4216-4226.

* cited by examiner

US 10,601,300 B2

INTEGRATED GALLIUM NITRIDE BASED DC-DC CONVERTER

CROSS-REFERENCE TO RELATED APPLICATIONS

This application claims the benefit of U.S. Provisional Application No. 62/508,498, filed on May 18, 2017 and titled "Integrated Gallium Nitride Based Power Conversion System on Chip", the entire contents of which are hereby incorporated by reference herein.

BACKGROUND

Power supplies and power converters are used in a variety of electronic systems. Electrical power is generally transmitted over long distances as an alternating current (AC) signal. The AC signal is divided and metered as desired for each business or home location, and is often converted to direct current (DC) for use with individual electronic devices or components. Modern electronic systems often employ devices or components designed to operate using different DC voltages. Accordingly, different DC-DC converters, or a DC-DC converter that supports a wide range of output voltages, are needed for such systems.

There are many different DC-DC converter topologies. The available topologies differ with regard to the components used, the amount of power handled, the input voltage(s), the output voltage(s), efficiency, reliability, size and/or other characteristics. Like many electronic components, ongoing innovation efforts for DC-DC converters involve a reduction in size. This is largely due to market demand for small components and the availability of integrated circuit (IC) fabrication technology.

Although IC fabrication technology provides an excellent platform for manufacturing circuits with repeated components, there are unmet challenges when it comes to manufacturing IC versions of DC-DC converters. These challenges are present to the extent different types of switches are needed to handle power conversion operations. This is because making different types of switches complicates, or makes unfeasible, the IC fabrication process. One way to deal with these challenges is to make separate IC DC-DC converters, each with a limited input voltage range and output voltage range. However, this solution does not leverage IC fabrication technology efficiently in that multiple IC dies and/or packages are needed for electronic systems designed to use a wide range of DC voltages. Efforts to improve DC-DC converter technology are ongoing.

SUMMARY OF THE INVENTION

In accordance with at least one example of the disclosure, an integrated DC-DC converter device comprises a plurality of sets of GaN transistors formed on a single substrate, wherein a first of the plurality of transistor sets includes at least one GaN transistor with a first drain-to-source distance, and wherein a second of the plurality of transistor sets includes at least one GaN transistor with a second drain-to-source distance that is greater than the first drain-to-source distance.

BRIEF DESCRIPTION OF THE DRAWINGS

For a detailed description of various examples, reference will now be made to the accompanying drawings in which.

DETAILED DESCRIPTION OF THE PREFERRED EMBODIMENTS

The disclosed embodiments are directed to integrated DC-DC converter devices with GaN transistors having different source-to-drain distances and blocking voltages. Use of GaN transistors with different source-to-drain distances and blocking voltages, as described herein, provides integrated DC-DC converter devices with increased voltage conversion ranges compared to existing architectures for integrated DC-DC converter devices.

In one embodiment, an integrated DC-DC converter device includes a three-stage DC-DC converter, where the three stages include GaN transistors with different source-to-drain distances and blocking voltages. In another embodiment, an integrated DC-DC converter device includes a two-stage DC-DC converter, where the two stages include GaN transistors with different source-to-drain distances and blocking voltages. In yet another embodiment, an integrated DC-DC converter device includes a single stage DC-DC converter, where the single stage includes GaN transistors with different source-to-drain distances and blocking voltages. In various embodiments, a one-stage, two-stage, or three-stage integrated DC-DC converter with GaN transistors having different source-to-drain distances and blocking voltages can be combined with other DC-DC converter stages as desired.

In various embodiments, the disclosed integrated DC-DC converter devices also include control circuitry (e.g., gate drive components) and/or passive components (e.g., resistors, capacitors, and/or inductors). The control circuitry and/or passive components included in an integrated DC-DC converter devices may be components of a single DC-DC converter stage or multiple DC-DC converter stages. Also, in at least some embodiments, disclosed integrated DC-DC converter devices includes isolation between GaN transistors with different source-to-drain distances and blocking voltages. For example, the isolation may include silicon-on-insulator (SOI) isolation or substrate well isolation. Also, in at least some embodiments, disclosed integrated DC-DC converter devices are packaged and/or include connection points to electrically connect integrated DC-DC converter devices to other electrical components. As an example, an integrated DC-DC converter device may include packaging, solder dots, and/or pins to connect different portions of the integrated DC-DC converter device to a printed circuit board (PCB) pads and/or other external components. To provide a better understanding, various integrated DC-DC converter device options, scenarios, and details are described with reference to the figures as follows.

Figure 1:
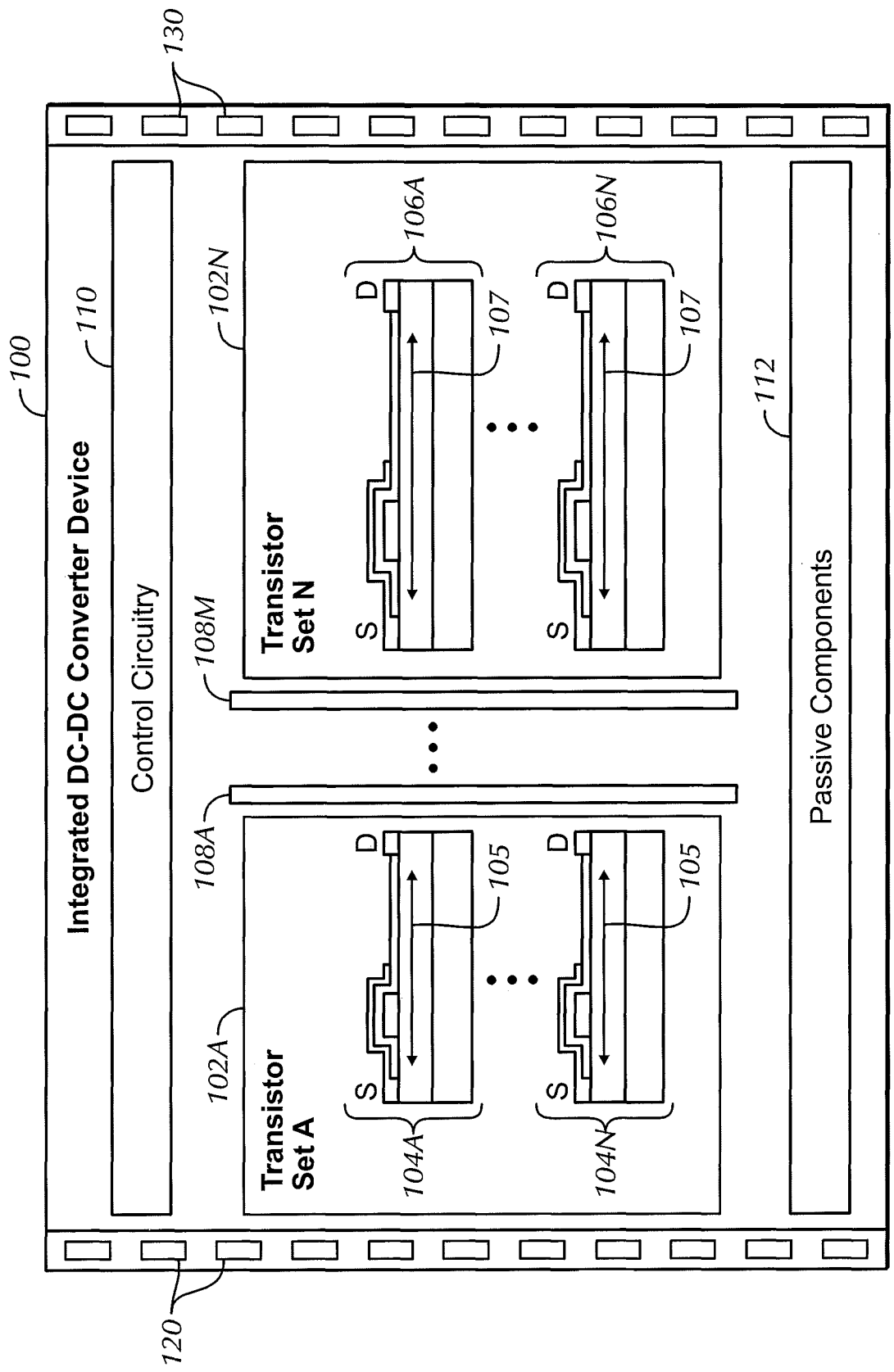
FIG. 1 shows a DC-DC converter device in accordance with various embodiments.

FIG. 1 shows a DC-DC converter device 100 in accordance with various embodiments. As shown, the DC-DC converter device 100 includes a plurality of GaN transistor sets 102A-102N, where each of the transistor sets 102A-102N includes respective GaN transistors with different source-to-drain distances and blocking voltages relative to other transistor sets. For example, each of the GaN transistors 104A-104N of the transistor set 102A have approximately the same source-to-drain distance 105, which correlates to a desired blocking voltage. Meanwhile, each of the GaN transistors 106A-106N of the transistor set 102N have another source-to-drain distance 107 (larger than the source-to-drain distance 105), which correlates to another desired blocking voltage. Likewise, the other represented transistor sets have respective transistors with a distinct source-to-drain distance and blocking voltage. In different embodiments, the number of transistor sets and the number of transistors in each set may vary. Thus, a given transistor set may only have one transistor or may have many transistors depending on the DC-DC converter topology or topologies represented by the DC-DC converter device 100.

As shown in FIG. 1, the integrated DC-DC converter device 100 also includes isolation 108A-108M that separate the different transistors sets 102A-102N. In different embodiments, the isolation 108A-108M may be silicon-on-insulator SOI isolation and/or substrate well isolation. When the integrated DC-DC converter device 100 is operating, the isolation 108A-108M prevents or reduces leakage current flow between adjacent transistor sets.

The integrated DC-DC converter device 100 also includes control circuitry 110. In at least some embodiments, the control circuitry 110 includes gate drive components that provide control signals for the transistor sets 102A-102N. In some embodiments, the control circuitry 110 for all of the transistor sets 102A-102N is consolidated in one area of the integrated DC-DC converter device 100. In other embodiments, the control circuitry 110 includes separate gate drive components for each transistor set 102A-102N or other transistor groupings. In one embodiment, the control circuitry 110 includes gate drive components for a single DC-DC converter stage. In other embodiments, the control circuitry 110 includes gate drive components for multiple DC-DC converter stages (e.g., two stages or three stages).

The integrated DC-DC converter device 100 also includes passive components 112 such as resistors, capacitors, and inductors. In different embodiments, the passive components 112 vary according to the DC-DC converter topology or topologies selected for the integrated DC-DC converter device 100. In one embodiment, the passive components 112 are for a single DC-DC converter stage. In other embodiments, the passive components 112 are for multiple DC-DC converter stages (e.g., two stages or three stages). In at least some embodiments, the passive components 112 include smoothing inductors for one or more DC-DC converter stages. In at least some embodiments, the passive components 112 include input capacitors for one or more DC-DC converter stages. In at least some embodiments, the passive components 112 include output capacitors for one or more DC-DC converter stages. In other embodiments, input capacitors and/or output capacitors for one or more DC-DC converter stages are not included with the integrated DC-DC converter device 100. In such embodiments, input capacitors and/or output capacitors are external components selected by manufacturers that install the integrated DC-DC converter device 100 as part of a larger electrical system. To facilitate use of the integrated DC-DC converter device 100 as part of a larger electrical system, input connection points 120 and output connection points 130 are included with the integrated DC-DC converter device 100. In different embodiments, the input connection points 120 and output connection points 130 are connection points for a single DC-DC converter stage or multiple DC-DC converter stages (e.g., two or three stages). For example, in multi-stage DC-DC converter embodiments, outputs for different stages may stay on chip and/or may pass to external components via some of the output connection points 130. Also, in multi-stage DC-DC converter embodiments, inputs for different stages may be received internally or may be received via some of the input connection points 120.

Figure 2:
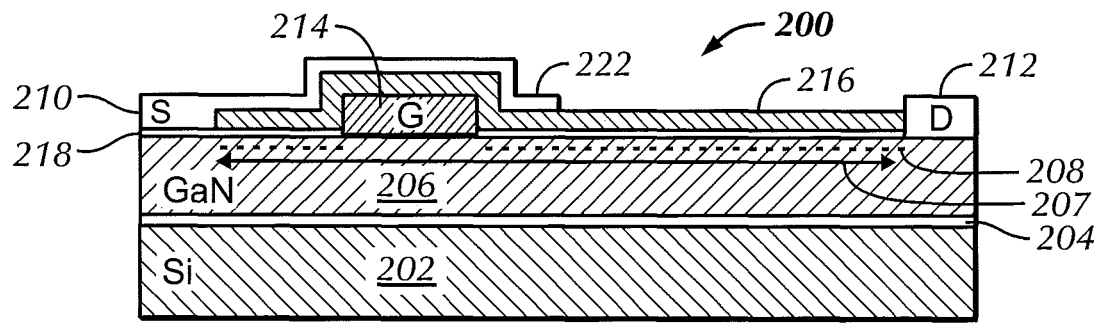
FIG. 2 shows a gallium nitride (GaN) transistor in accordance with various embodiments.

FIG. 2 shows a GaN transistor topology 200 in accordance with various embodiments. In at least some embodiments, the GaN transistor topology 200 is used to fabricate the transistors in the transistor sets 102A-102N introduced in FIG. 1. As shown, GaN transistor 200 includes a semiconductor substrate 202 (e.g., silicon) and an isolation layer 204 (e.g., aluminum nitride) over the semiconductor substrate 202. A GaN layer 206 is disposed over the isolation layer 204. A two-dimensional electron gas (2DEG) 208 is created at the top of the GaN layer 206, as shown.

GaN transistor 200, includes contacts for source (S) 210, a drain (D) 212, and a gate (G) 214. In at least some embodiments, an electron generating layer 218, preferably aluminum gallium nitride (AlGaN), is disposed over the GaN layer 206 at least in the area between the gate 214 and the source 210, and the area between the gate 214 and the drain 212. As shown, a dielectric layer 216 covers the gate 214 and extends to the source 210 and the drain 212. In at least some embodiments, a field plate 222 coupled to the source 210 extends over part of the dielectric layer 216, covering the gate 214.

The GaN transistor architecture 200 is a lateral transistor architecture. By varying the source-to-drain distance 207, the blocking voltage of a transistor with architecture 200 can be adjusted. Adjustments in the blocking voltage for architecture 200 may be understood to be changes in the gate-to-drain distance rather than the source-to-drain distance 207.

In operation, GaN-based transistors behave similarly to silicon-based power metal-oxide semiconductor field-effect transistors (MOSFETs). In enhancement mode devices, a positive bias on the gate 214 relative to the source 210 causes a field effect which attracts electrons that complete a bidirectional channel between the drain 212 and the source 210. Since the electrons are pooled, as opposed to being loosely trapped in a lattice, the resistance of this channel is quite low. When the bias is removed from the gate 214, the electrons under it are dispersed into the GaN layer 206, recreating the depletion region, and once again, giving it the capability to block voltage.

Figure 3:
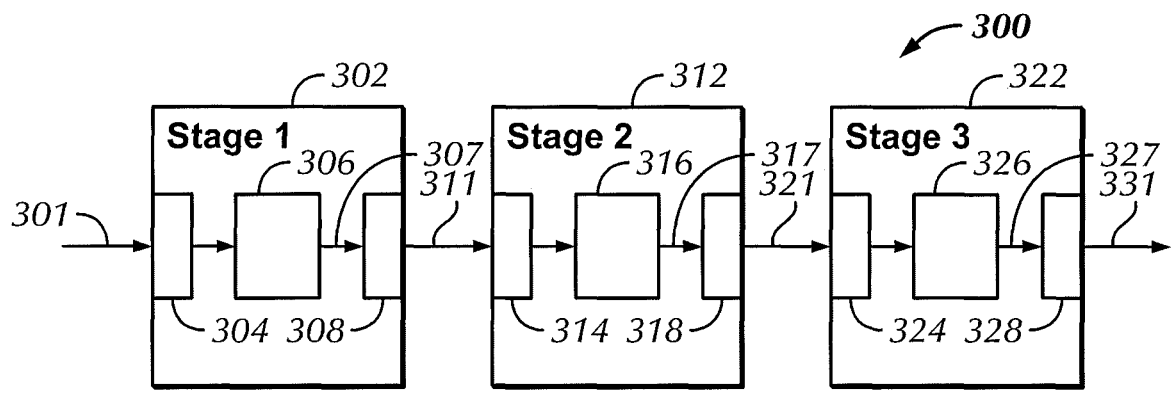
FIG. 3 shows a block diagram of a multi-stage DC-DC converter in accordance with various embodiments.

FIG. 3 shows a block diagram of a multi-stage DC-DC converter 300 in accordance with various embodiments. As shown, the multi-stage DC-DC converter 300 includes a stage 1 converter 302, a stage 2 converter 312, and a stage 3 converter 322. More specifically, the stage 1 converter 302 includes an input interface 304, a converter topology 306, and an output interface 308. Similarly, the stage 2 converter 312 includes an input interface 314, a converter topology 316, and an output interface 318. Also, the stage 3 converter 322 includes an input interface 324, a converter topology 326, and an output interface 328. In various embodiments, the converter topology 306 can be made using GaN transistors with different source-to-drain distances and blocking voltages as well as other components (e.g., control circuitry and passive components). Likewise, the converter topology 316 can be made using GaN transistors with different source-to-drain distances and blocking voltages as well as other components (e.g., control circuitry and passive components). Likewise, the converter topology 326 can be made using GaN transistors with different source-to-drain distances and blocking voltages as well as other components (e.g., control circuitry and passive components).

In operation, the stage 1 converter 302 receives an input signal 301 (e.g., an AC or DC signal) at the input interface 304, which includes pads, pins, or other connection points. The input signal 301 is conveyed via the input interface 304 to the converter topology 306, which changes the input signal 301 to an output signal 307 with different voltage and current characteristics than the input signal 301. The output signal 307 from the converter topology 306 is provided to the output interface 308 (e.g., pads, pins, or other connection points), and is provided as an input signal 311 to the stage 2 converter 312. In some embodiments, the input signal 311 is also provided to a load (e.g., electronics designed to operate on a voltage level corresponding to the voltage level of the input signal 311).

The stage 2 converter 312 receives the input signal 311 at the input interface 314, which includes pads, pins, or other connection points. The input signal 311 is conveyed via the input interface 314 to the converter topology 316, which changes the input signal 311 to an output signal 317 with different voltage and current characteristics than the input signal 311. The output signal 317 from the converter topology 316 is provided to the output interface 318 (e.g., pads, pins, or other connection points), and is provided as an input signal 321 to the stage 3 converter 322. In some embodiments, the input signal 321 is also provided to a load (e.g., electronics designed to operate based on a voltage level corresponding to voltage level of the input signal 321).

The stage 3 converter 322 receives the input signal 321 at the input interface 324, which includes pads, pins, or other connection points. The input signal 321 is conveyed via the input interface 324 to the converter topology 326, which changes the input signal 321 to an output signal 327 with different voltage and current characteristics than the input signal 321. The output signal 327 from the converter topology 326 is provided to the output interface 328 (e.g., pads, pins, or other connection points), and is provided as signal 331, which may be provided to a load (e.g., electronics designed to operate based on a voltage level corresponding to the voltage level of the signal 331) and/or to other converter stages.

In different embodiments, an integrated DC-DC converter device (see e.g., device 100) includes one or more of the stage 1 converter 302, the stage 2 converter 312, and the stage 3 converter 322. For multi-stage embodiments, some of the input interfaces and/or output interface may by omitted. Also, in different embodiments, the converter topologies 306, 316, and 326 may vary. Without limitation to other embodiments, several preferred converter topologies are described below.

Figure 4A:
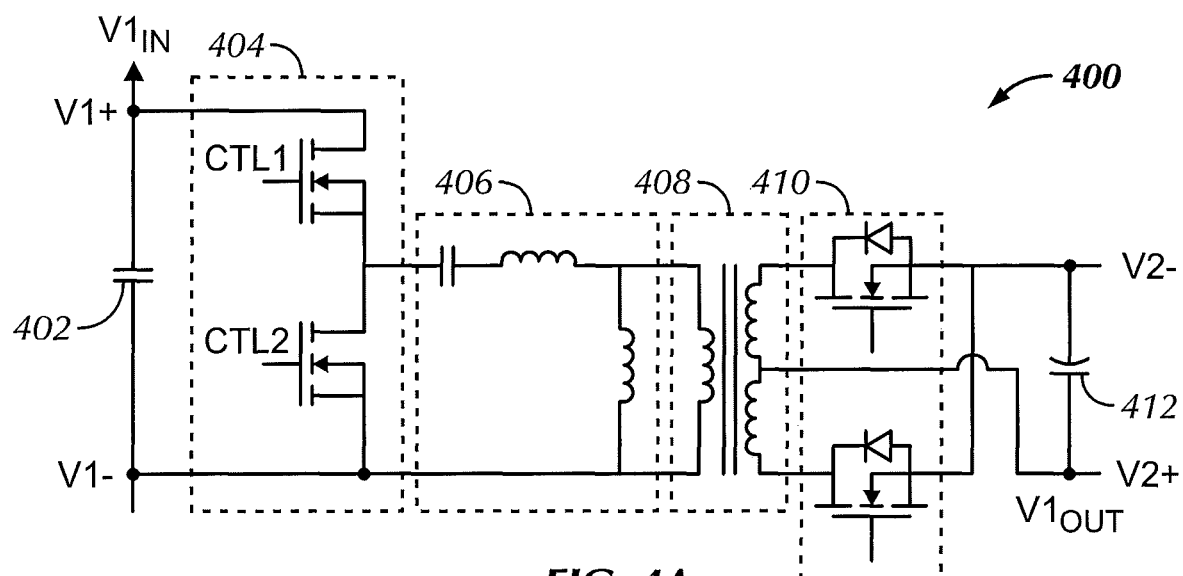
FIGS. 4A and 4B show schematic diagrams of stage 1 DC-DC converter topologies in accordance with various embodiments.
Figure 4B:
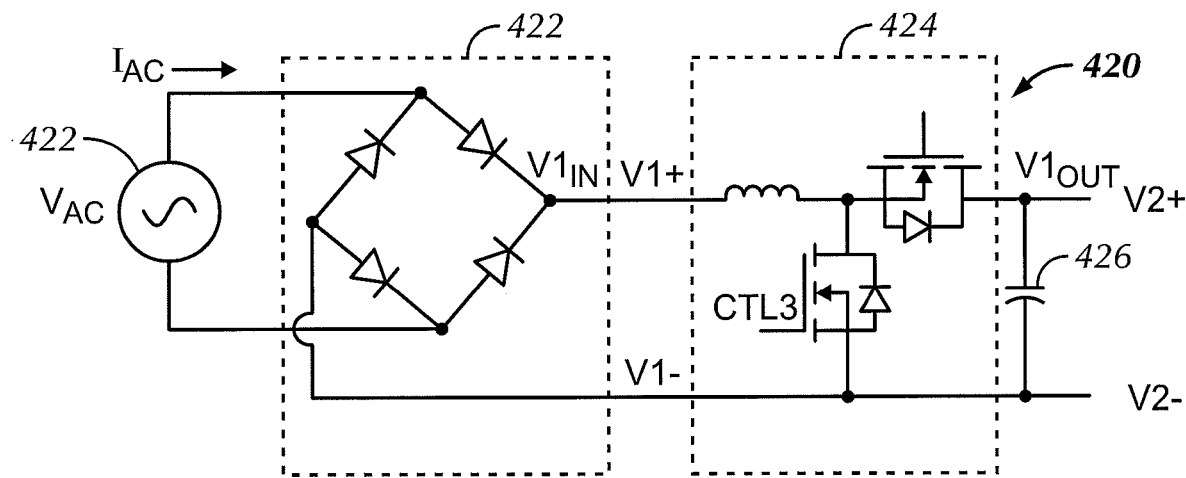

FIGS. 4A and 4B show schematic diagrams of stage 1 DC-DC converter topologies (e.g., converter topology 306 in FIG. 3) in accordance with various embodiments. More specifically, FIG. 4A shows a schematic diagram of an inductor/inductor/capacitor (LLC) resonant converter topology 400. As shown, the LLC resonant converter topology 400 includes an input capacitor 402 that receives a stage 1 input voltage ($V1_{IN}$). In the LLC resonant converter topology 400, $V1_{IN}$ is passed to a switch arrangement 404 with a high-side transistor controlled by CTL1 and a low-side transistor controlled by CTL2. A controller (i.e., gate drive components) to provide the CTL1 and CTL2 signals is not shown. The switch arrangement 404 operates to selectively pass V+ or V− to an LLC circuit 406, resulting in a resonant signal on both sides of transformer 408. A rectification arrangement 410 (e.g., power transistors/synchronous rectifiers) rectifies the signal on the output side of transformer 408, resulting in a stage 1 output signal ($V1_{OUT}$) across an output capacitor 412.

FIG. 4B shows a schematic diagram of a boost power factor correction (PFC) topology 420. As shown, the PFC topology 420 includes an AC source 422 coupled to a full bridge rectifier 422. The output of the bridge rectifier 422 is the stage 1 input voltage, $V1_{IN}$. $V1_{IN}$ is received by a boost PFC circuit 424 (an inductor, a transistor switch controlled by CTL3, and a power transistor/synchronous rectifier), resulting in a stage 1 output signal ($V1_{OUT}$) across an output capacitor 426. A controller (i.e., gate drive components) to provide the CTL3 signal is not shown. In some embodiments, $V1_{OUT}$ for the PFC topology 420 is provided to another stage 1 topology (e.g., topology 400).

In different embodiments, an integrated DC-DC converter device (e.g., device 100 of FIG. 1) includes the LLC resonant converter topology 400, where the input capacitor 402 and/or the output capacitor 412 are omitted (e.g., they may be external components in some embodiments). Additionally or alternatively, an integrated DC-DC converter device (e.g., device 100 of FIG. 1) includes the PFC topology 420, where the AC source 422 is omitted (e.g., it is an external component). Also, an integrated DC-DC converter device based on the PFC topology 420 may omit rectifier arrangement 422 and/or the output capacitor 426 (e.g., they may be external components in some embodiments). In some embodiments, an integrated DC-DC converter device includes a boost PFC circuit (e.g., the boost PFC circuit 424) at the input side of an LLC resonant circuit topology (e.g., topology 400). In one example, the stage 1 converter receives an input voltage of 400V and provides an output voltage of 48V.

Figure 5A:
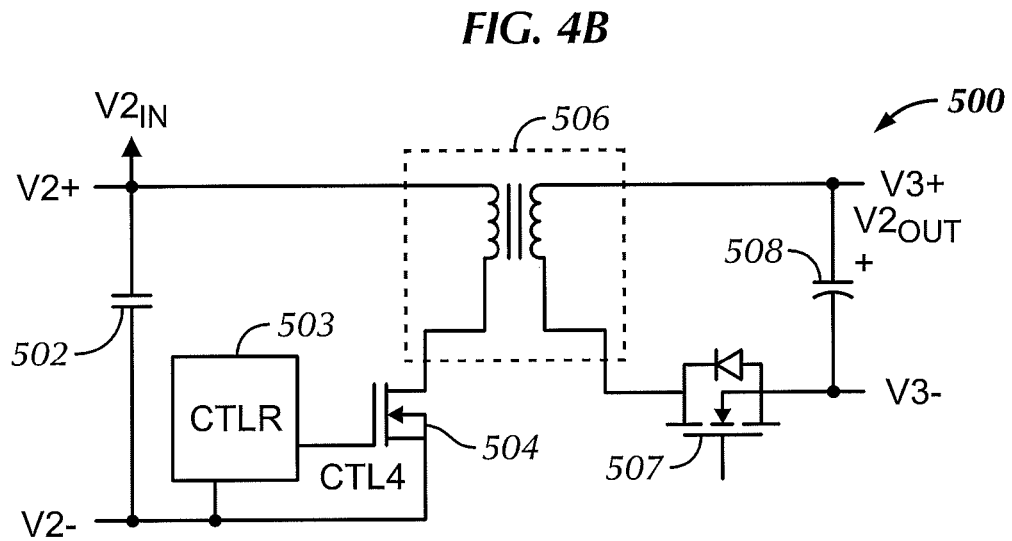
FIGS. 5A-5F show schematic diagrams of stage 2 DC-DC converter topologies in accordance with various embodiments.

FIGS. 5A-5F show schematic diagrams of stage 2 DC-DC converter topologies in accordance with various embodiments. In FIG. 5A, a flyback converter topology 500 is represented. As shown, the flyback converter topology 500 includes an input capacitor 502 that receives a stage 2 input voltage ($V2_{IN}$). In the flyback converter topology 500, the operation of the switch 504, which is controlled by a control signal (CTL4) from controller 503 (i.e., gate drive components), results in an AC signal on both sides of the transformer 506. The AC signal on the output side of the transformer 506 is rectified by a power transistor/synchronous rectifier 507, and the rectified signal is received by an output capacitor 508. The voltage across the output capacitor 508 is the stage 2 output signal ($V2_{OUT}$).

Figure 5B:
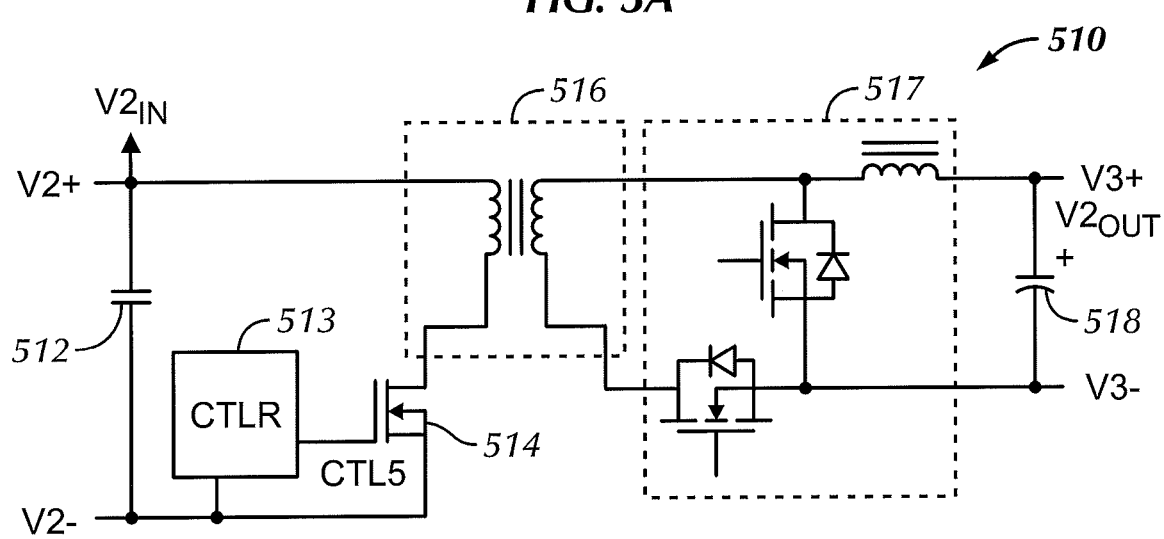

In FIG. 5B, a single transistor forward converter topology 510 is represented. As shown, the single transistor forward converter topology 510 includes an input capacitor 512 that receives a stage 2 input voltage ($V2_{IN}$). In the single transistor forward converter topology 510, the operation of the switch 514, which is controlled by a control signal (CTL5) from controller 513 (i.e., gate drive components), results in an AC signal on both sides of the transformer 516. The AC signal on the output side of the transformer 516 is rectified and/or smoothed by rectifier arrangement 517, and the rectified signal is received by an output capacitor 518. The voltage across the output capacitor 518 is the stage 2 output signal ($V2_{OUT}$).

Figure 5C:
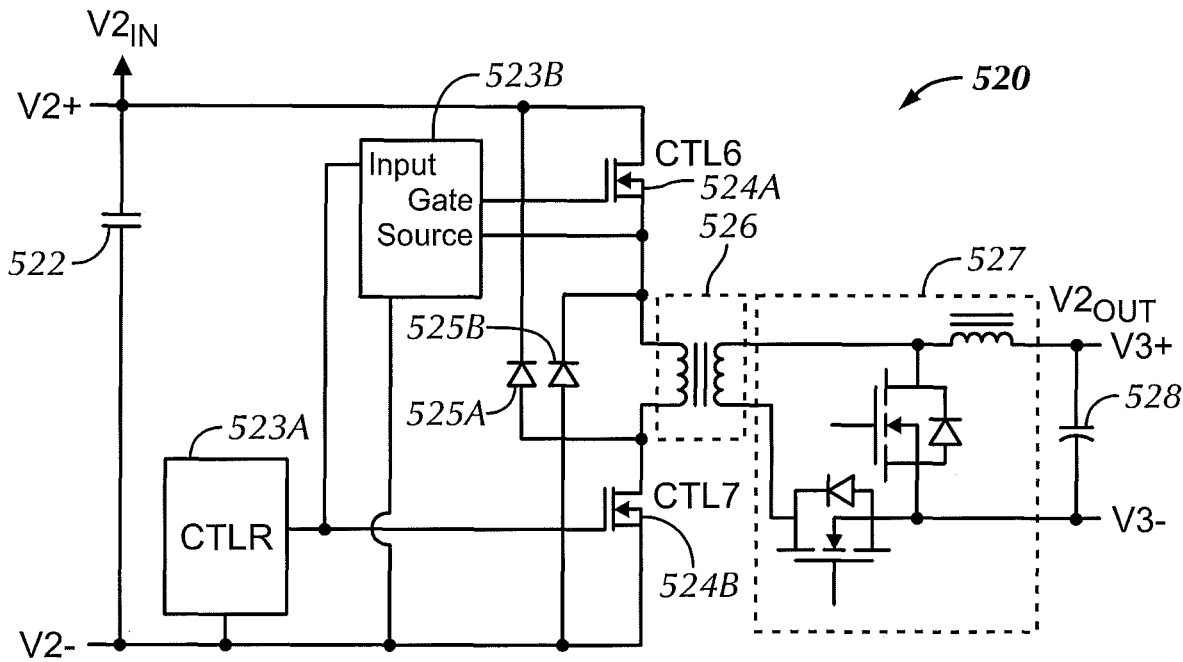

In FIG. 5C, a two transistor forward converter topology 520 is represented. As shown, the two transistor forward converter topology 520 includes an input capacitor 522 that receives a stage 2 input voltage ($V2_{IN}$). In the two transistor forward converter topology 520, the operation of diodes 525A and 525B as well as the switches 524A and 524B, which are controlled by control signals (CTL6 and CTL7) from controller 523 (i.e., gate drive components), results in an AC signal on both sides of the transformer 526. The AC signal on the output side of the transformer 526 is rectified and/or smoothed by rectifier arrangement 527, and the rectified signal is received by an output capacitor 528. The voltage across the output capacitor 528 is the stage 2 output signal ($V2_{OUT}$).

Figure 5D:
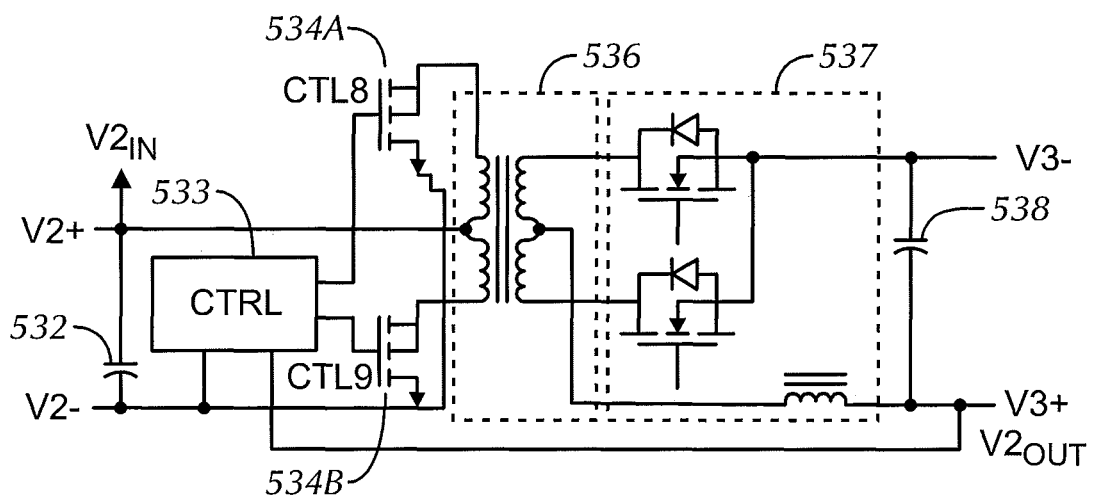

In FIG. 5D, a push-pull converter topology 530 is represented. As shown, the push-pull converter topology 530 includes an input capacitor 532 that receives a stage 2 input voltage ($V2_{IN}$). In the push-pull converter topology 530, the operation of the switches 534A and 534B, which are controlled by control signals (CTL8 and CTL9) from controller 533 (i.e., gate drive components), results in an AC signal on both sides of the transformer 536. The AC signal on the output side of the transformer 536 is rectified and/or smoothed by rectifier arrangement 537, and the rectified signal is received by an output capacitor 538. The voltage across the output capacitor 538 is the stage 2 output signal ($V2_{OUT}$).

Figure 5E:
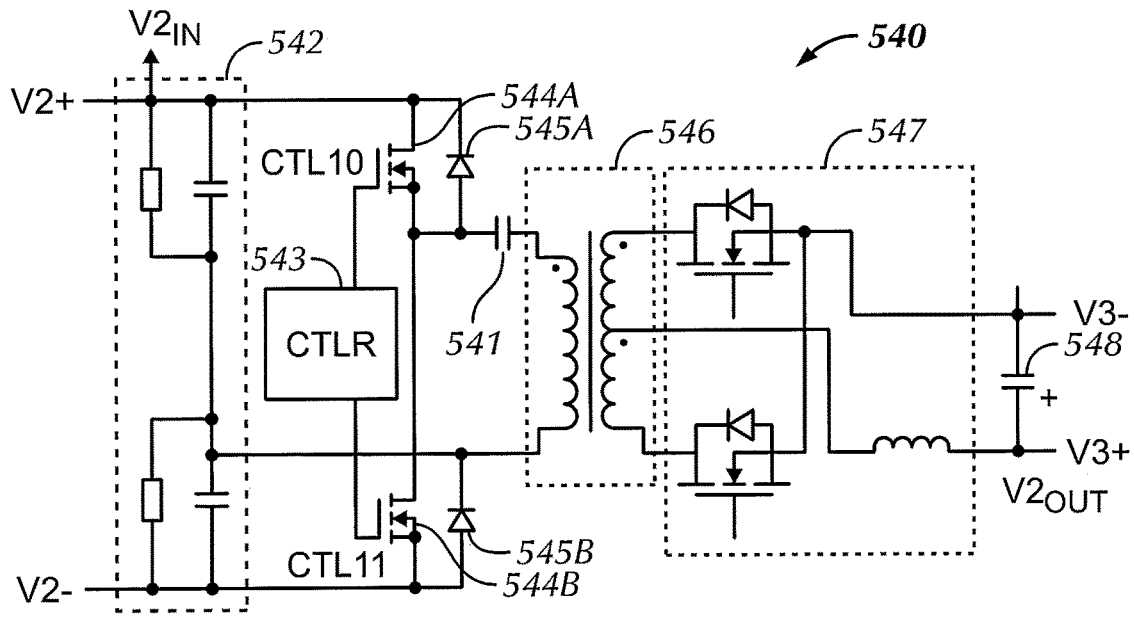

In FIG. 5E, a half-bridge converter topology 540 is represented. As shown, the half-bridge converter topology 540 includes an input arrangement 542 (e.g., input capacitors and resistors) that receives a stage 2 input voltage ($V2_{IN}$). In the half-bridge converter topology 540, the operation of diodes 545A and 545B, capacitor 541, and switches 544A and 544B, which are controlled by control signals (CTL10 and CTL11) from controller 543 (i.e., gate drive components), results in an AC signal on both sides of the transformer 546. The AC signal on the output side of the transformer 546 is rectified and/or smoothed by rectifier arrangement 547, and the rectified signal is received by an output capacitor 548. The voltage across the output capacitor 548 is the stage 2 output signal ($V2_{OUT}$).

Figure 5F:
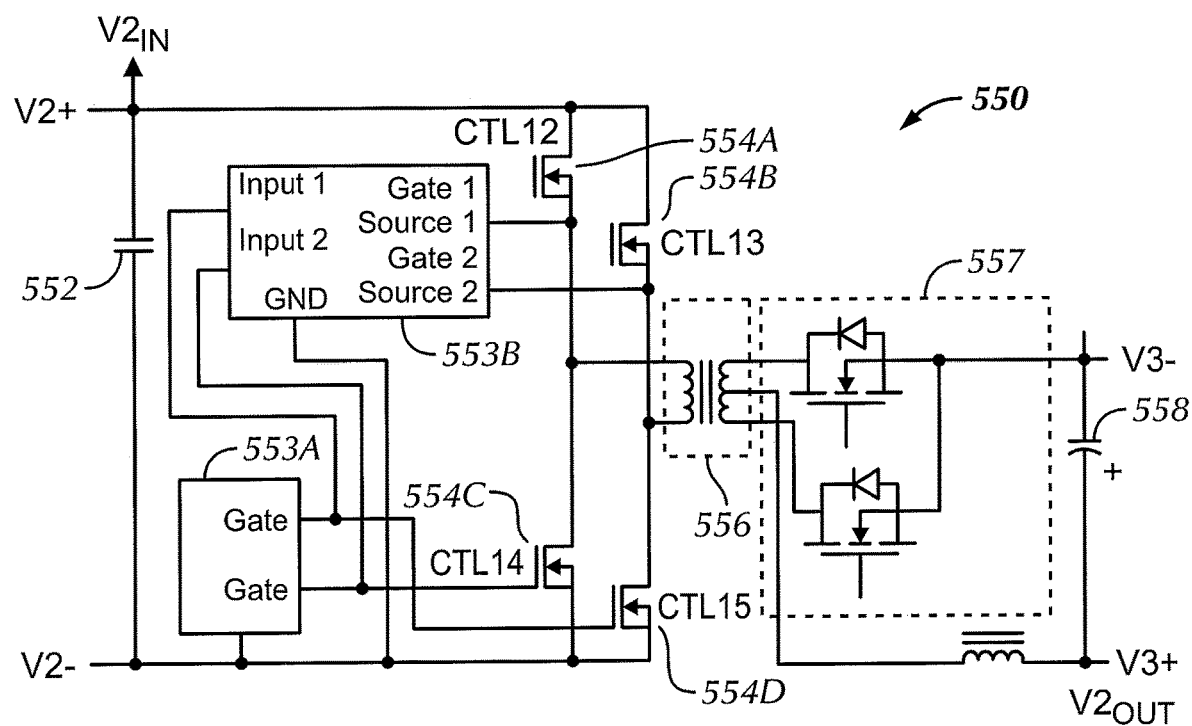

In FIG. 5F, a full-bridge converter topology 550 is represented. As shown, the full-bridge converter topology 550 includes an input capacitor 542 that receives a stage 2 input voltage ($V2_{IN}$). In the full-bridge converter topology 550, the operation of switches 544A-544D, which are controlled by control signals (CTL12-CTL15) from controllers 553A and 553B (i.e., gate drive components), results in an AC signal on both sides of the transformer 556. The AC signal on the output side of the transformer 556 is rectified and/or smoothed by rectifier arrangement 557, and the rectified signal is received by an output capacitor 558. The voltage across the output capacitor 558 is the stage 2 output signal ($V2_{OUT}$).

In different embodiments, the integrated DC-DC converter device (e.g., device 100 of FIG. 1) includes one of the stage 2 converter topologies 500, 510, 520, 530, 540, or 550, where the respective input capacitor and/or the respective output capacitor may be omitted (e.g., they may be external components in some embodiments). In one example, the stage 2 converter receives an input voltage of 48V and provides an output voltage of 12V.

Figure 6A:
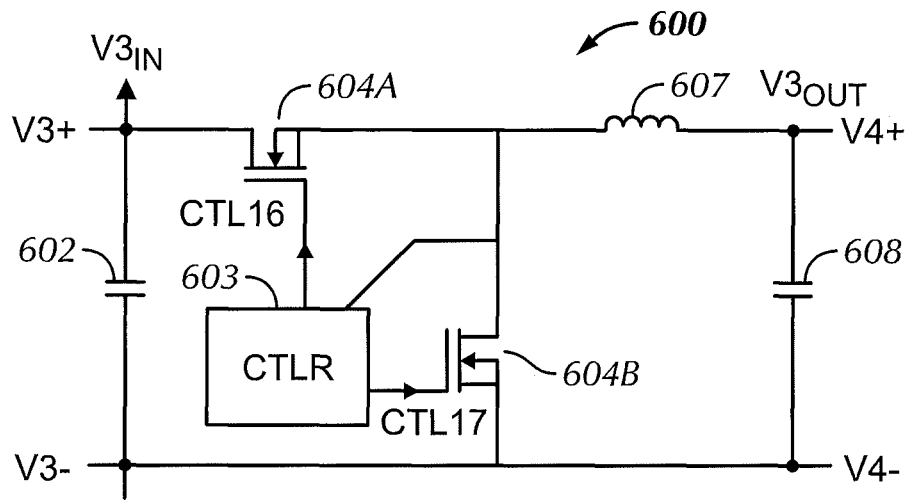
FIG. 6A shows a schematic diagram of a stage 3 DC-DC converter topology in accordance with various embodiments.

FIG. 6A shows a schematic diagram of a stage 3 DC-DC converter topology 600 in accordance with various embodiments. Specifically, the stage 3 DC-DC converter topology 600 is a buck converter. As shown, the topology 600 includes an input capacitor 602 that receives a stage 3 input voltage ($V3_{IN}$). In the topology 600, the operation of switches 604A and 604B, which are controlled by control signals (CTL16 and CTL17) from controller 603 (i.e., gate drive components), results in V3+ or V3- being passed to an inductor 607. The inductor 607 smooths the signal, resulting in $V3_{OUT}$ across an output capacitor 608. If there are no subsequent stages, $V3_{OUT}$ is provided to one or more loads.

In different embodiments, the integrated DC-DC converter device (e.g., device 100 of FIG. 1) includes the stage 3 converter topology 600, where the input capacitor 602 and/or the output capacitor 608 may be omitted (e.g., they may be external components in some embodiments). In one example, stage 3 converter receives an input voltage of 12V and provides an output voltage of 1V.

In various embodiments, an integrated DC-DC converter device (e.g., device 100 of FIG. 1) includes GaN transistors with different source-to-drain distances and blocking voltages, where the transistors are part of a stage 1 converter topology (e.g., topologies 400 or 420). In other embodiments, an integrated DC-DC converter device (e.g., device 100 of FIG. 1) includes GaN transistors with different source-to-drain distances and blocking voltages, where the transistors are part of a stage 2 converter topology (e.g., topologies 500, 510, 520, 530, 540, or 550). In other embodiments, an integrated DC-DC converter device (e.g., device 100 of FIG. 1) includes GaN transistors with different source-to-drain distances and blocking voltages, wherein the transistors are part of a stage 3 converter topology (e.g., topology 600). In some embodiments, the integrated DC-DC converter device (e.g., device 100 of FIG. 1) includes GaN transistors with different source-to-drain distances and blocking voltages, where the transistors are part of a multi-stage converter (e.g., a combination of stage 1 and stage 2 converter topologies, a combination of stage 2 and stage 3 converter topologies, or a combination of stage 1, stage 2, and stage 3 converter topologies).

Figure 6B:
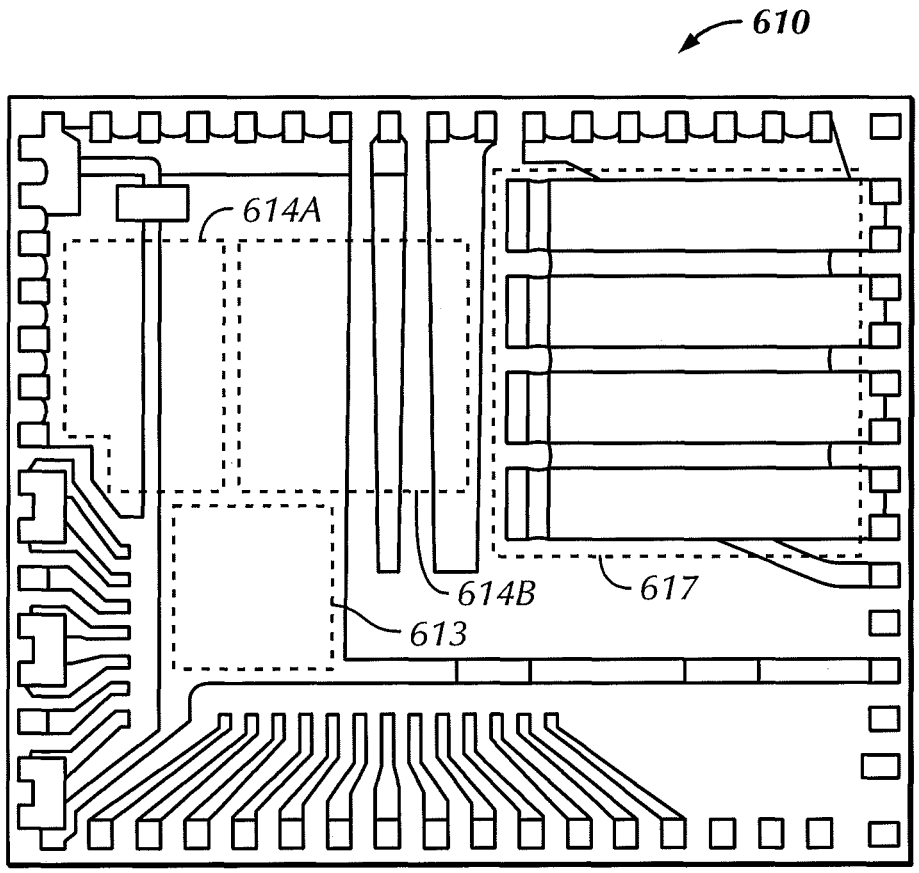
FIG. 6B shows a top view of an integrated circuit with the DC-DC converter topology of FIG. 6A in accordance with various embodiments.

FIG. 6B shows a top view of an integrated circuit 610 with the DC-DC converter topology of FIG. 6A in accordance with various embodiments. As shown, the integrated circuit 610 includes a first transistor layout 614A corresponding to transistor 604A. The integrated circuit 610 also includes a second transistor layout 614B corresponding to transistor 604B. A controller layout 613 in integrated circuit 610 includes controller 603 (i.e., gate drive components). Finally, an inductor layout 617 includes inductor 607. The capacitors 602 and 608 represented in topology 600 are omitted from the integrated circuit 610. As desired, such capacitors can be connected to input and output connection points (not specifically designated) of the integrated circuit 610. In different embodiments, the position and size of transistor layouts, controller layouts, and inductor layouts in an integrated circuit such as integrated circuit 610 may vary. Further, in some embodiments, an integrated circuit may include stage 1 or stage 2 converter components instead of stage 3 converter components. Further, in some embodiments, an integrated circuit may include components for multiple stages (stages 1-2, stages 2-3, stages 1-3, etc.).

Figure 7:
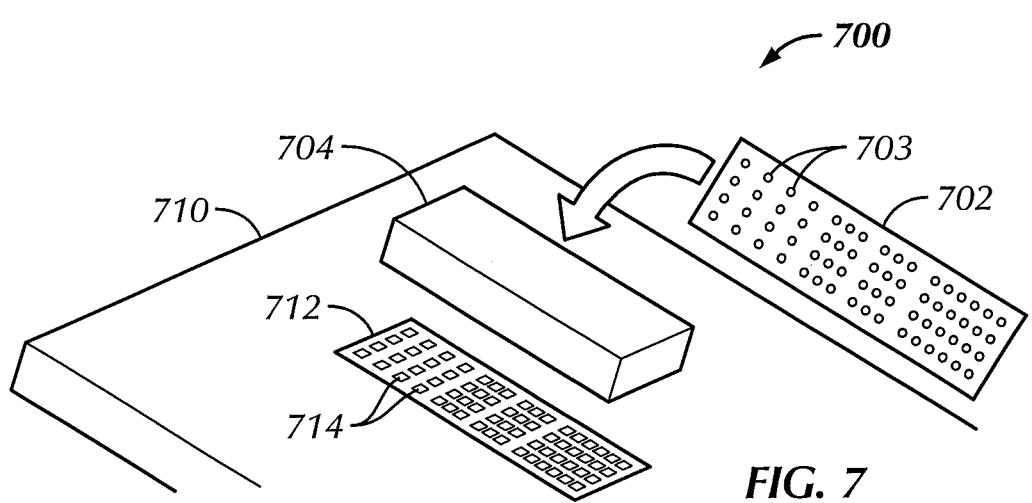
FIG. 7 shows a perspective view of a system on chip (SoC) and related printed circuit board (PCB) in accordance with various embodiments.

FIG. 7 shows a perspective view 700 of a system on chip (SoC) device 702 and related PCB 710. The SoC device 702 includes a single integrated circuit with GaN transistors with different source-to-drain distances and blocking voltages as described herein. The SoC device 702 includes an integrated circuit with a single stage converter (e.g., a stage 1 converter, a stage 2 converter, a stage 3 converter, etc.), or a multi-stage converter (stages 1-2, stages 2-3, stages 1-3, etc.). In various embodiments, the SoC device 702 can be connected to other components. For example, in some embodiments, the SoC device 702 is part of a SoC package 704 with solder dots 703 or other connection points. When aligned with corresponding pads 714 on a PCB 710, heat may be applied to couple the solder dots 703 to the corresponding pads 714. The pads 714 couple to traces and/or other components on the PCB 710, such that the SoC device 702 becomes part of a larger electronic system that relies on the SoC device 702 for DC-DC converter operations.

FIGS. 8-12 show block diagrams of multi-stage DC-DC converter scenarios in accordance with various embodiments. In the multi-stage DC-DC converter scenario 800 of FIG. 8, a multi-stage converter SoC device 802 with GaN transistors with different source-to-drain distances and blocking voltages is represented. More specifically, the multi-stage converter SoC device 802 includes three converter stages 810, 830, and 850. The stage 1 converter 810 includes a first integrated circuit portion 812 with a first transistor set 814, input connection points 811, and output connection points 813. The transistors of the first transistor set 814 include at least one GaN transistor, each GaN transistor having approximately the same source-to-drain distance as any other transistor in the first transistor set 814. The stage 1 converter 810 also includes a second integrated circuit portion 822 with a second transistor set 824, input connection points 821, and output connection points 823. The transistors of the second transistor set 824 include at least one GaN transistor, each GaN transistor having approximately the same source-to-drain distance as any other transistor in the second transistor set 824, and having a shorter source-to-drain distance than each transistor of the first transistor set 814. In one example, each transistor of the first transistor set 814 has a blocking voltage of approximately 600-650V and each transistor of the second transistor set 824 has a blocking voltage of approximately 100-200V. In this example, the stage 1 converter 810 can handle an input voltage of 400V and provide an output voltage of 48V.

The stage 2 converter 830 includes a third integrated circuit portion 832 with a third transistor set 834, input connection points 831 and output connection points 833. The transistors of the third transistor set 834 include at least one GaN transistor, each GaN transistor having approximately the same source-to-drain distance as any other transistor in the third transistor set 834, and having a shorter source-to-drain distance than each transistor of the transistor sets 814 and 824. The stage 2 converter 830 also includes a fourth integrated circuit portion 842 with a fourth transistor set 844, input connection points 841 and output connection points 843. The transistors of the fourth transistor set 844 include at least one GaN transistor, each GaN transistor having approximately the same source-to-drain distance as any other transistor in the fourth transistor set 844, and having a shorter source-to-drain distance than each transistor of the transistor sets 814, 824, and 834. In an example, each transistor of the third transistor set 834 has a blocking voltage of 80-100V and each transistor of the fourth transistor set 844 has a blocking voltage of 30-60V. In this example, the stage 2 converter 830 can handle an input voltage of 48V and provide an output voltage of 12V.

The stage 3 converter 850 includes a fifth integrated circuit portion 852 with a fifth transistor set 854, input connection points 851 and output connection points 853. The transistors of the fifth transistor set 854 include at least one GaN transistor, each GaN transistor having approximately the same source-to-drain distance as any other transistor in the fifth transistor set 854, and having a shorter source-to-drain distance) than each transistor of the transistor sets 814, 824, 834, and 844. In an example, each transistor of the fifth transistor set 854 has a blocking voltage of 20-30V. In this example, the stage 3 converter 850 can handle an input voltage of 12 and provide an output voltage of 1V.

Figure 8:
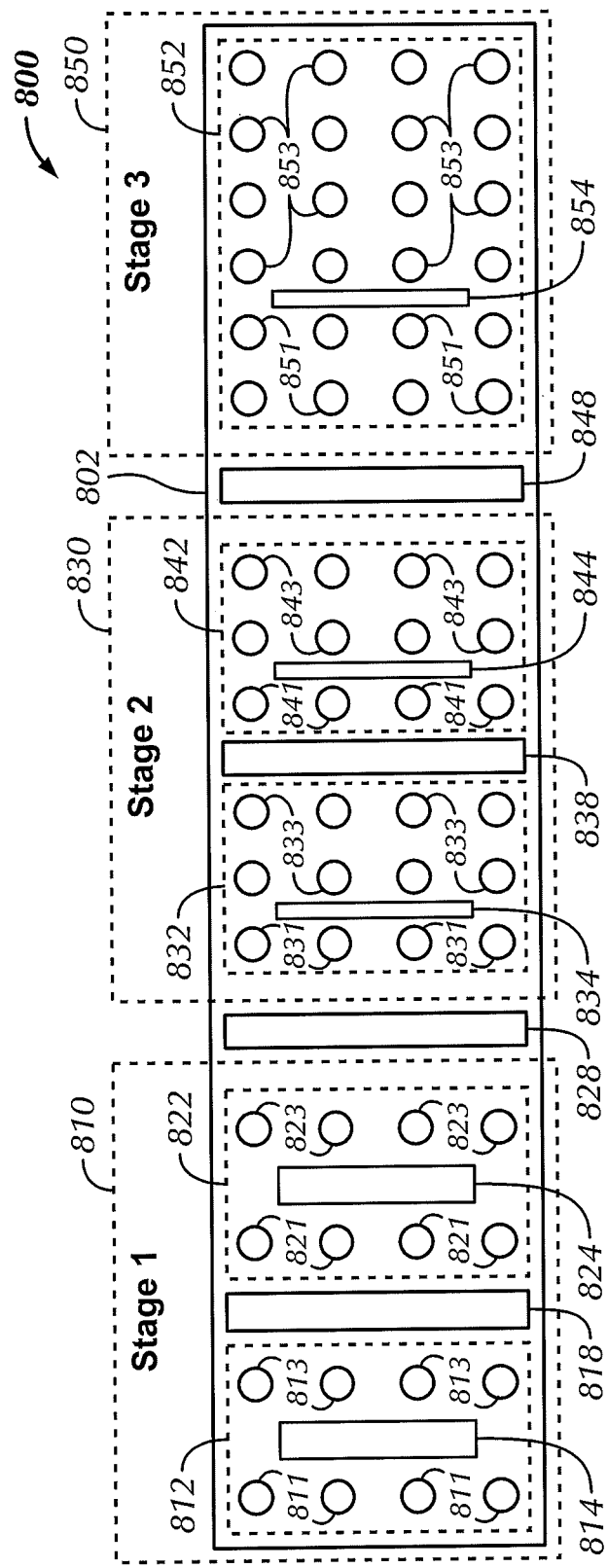
FIGS. 8-12 show block diagrams of multi-stage DC-DC converter scenarios in accordance with various embodiments.

In FIG. 8, the multi-stage converter SoC device 802 includes isolation 818, 828, 838, and 848 (e.g., SOI isolation or substrate well isolation) between the different integrated circuit portions. More specifically, isolation 818 is between the first and second integrated circuit portions 812 and 822. Also, isolation 828 is between the second and third integrated circuit portions 822 and 832. Also, isolation 838 is between the third and fourth integrated circuit portions 832 and 842. Finally, isolation 848 is between the fourth and fifth integrated circuit portions 842 and 852.

In different embodiments of the multi-stage converter SoC device 802, the position and quantity of input and output connection points for each of the integrated circuit portions 812, 822, 832, 842, and 852 may vary. As an example, if signals (e.g., $V1_{OUT}$, $V2_{OUT}$, $V3_{OUT}$) are to be output from the device 802 at each of the integrated circuit portions 812, 822, 832, 842, and 852, then the multi-stage converter SoC device 802 may include input and output connections points for each integrated circuit portions 812, 822, 832, 842, and 852 as shown in FIG. 8. Alternatively, if signals (e.g., $V1_{OUT}$, $V2_{OUT}$, $V3_{OUT}$) are not output from the device 802 for each of the integrated circuit portions 812, 822, 832, 842, and 852, then the multi-stage converter SoC device 802 may omit some of the input and output connections points. For example, the output connection points 813, 823, 833, 843 and the input connection points 821, 831, 841, 851 are omitted in some embodiments (only the input connection points 811 and the output connection points 853 are used to connect the multi-stage converter SoC device 802 to external components). Other variations are possible. In some embodiments, input and output connection points for each of the integrated circuit portions 812, 822, 832, 842, and 852 are needed due to the isolation 818, 828, 838, and 848. In other embodiments, one or more of isolation 818, 828, 838, and 848 are omitted and/or the multi-stage converter SoC device 802 includes internal connectors between adjacent integrated circuit portions.

In some embodiments, the multi-stage converter SoC device 802 also includes control circuitry (e.g., gate drive components) and/or passive components. Such control circuitry generates gate driver signals for the transistor sets 814, 824, 834, 844, and 854. Meanwhile, the passive components (e.g., resistors, capacitors, and inductors) included with the multi-stage converter SoC device 802 may vary according to the DC-DC converter topologies selected for stages 810, 830, 850 of the multi-stage converter SoC device 802.

Figure 9:
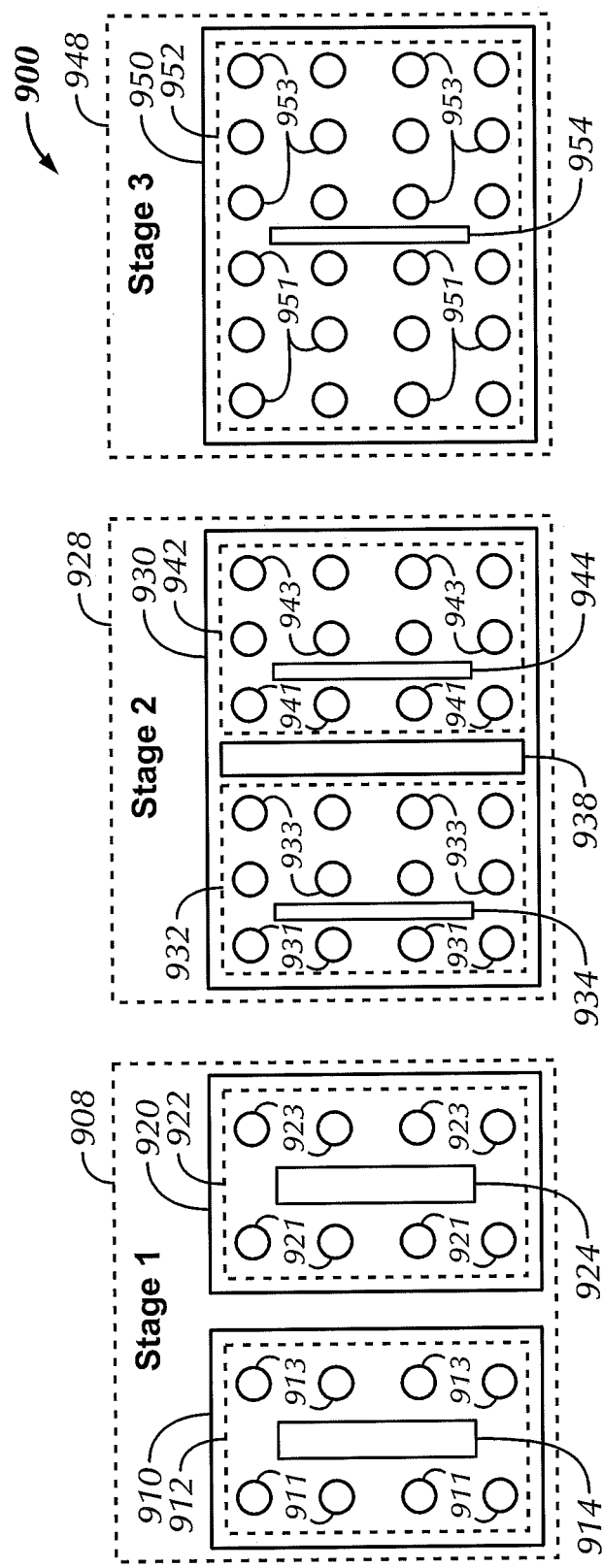

In FIG. 9, a multi-stage converter scenario 900 with a stage 1 converter 908, a stage 2 converter 928, and a stage 3 converter 948 is represented, where the stage 2 converter 928 includes a stage 2 converter SoC device 930 with GaN transistors with different source-to-drain distances and blocking voltages. More specifically, the stage 1 converter 908 includes first stage 1 converter device 910 and second stage 1 converter device 920. The first stage 1 converter device 910 includes an integrated circuit portion 912 with a transistor set 914, input connection points 911 and output connection points 913. Similarly, the second stage 1 converter device 920 includes an integrated circuit portion 922 with a transistor set 924, input connection points 921 and output connection points 923. The various input and output connection points 911, 913, 921, 923 enable the first stage 1 converter device 910 and the second stage 1 converter device 920 to couple to each other and/or other components.

In some embodiments, the transistors of the transistor set 914 in the first stage 1 converter device 910 include at least one GaN transistor, each GaN transistor having approximately the same source-to-drain distance as any other transistor in the transistor set 914. In other embodiments, the transistors of the transistor set 914 are silicon transistors. Further, in some embodiments, the transistors of the transistor set 924 in the second stage 1 converter device 920 include at least one GaN transistor, each GaN transistor having approximately the same source-to-drain distance as any other transistor in the transistor set 924. In other embodiments, the transistors of the second transistor set 924 are silicon transistors. Regardless of the particular transistor type used, the transistor set 914 in the first stage 1 converter device 910 includes transistors with a first blocking voltage (e.g., 600-650V) and the transistor set 924 in the second stage 1 converter device 920 includes transistors with a second blocking voltage (e.g., 100-200V). As an example, the stage 1 converter 908 can handle an input voltage of 400V and provide an output voltage of 48V.

In the multi-stage converter scenario 900, the stage 2 converter 928 includes a stage 2 converter SoC device 930 with a first integrated circuit portion 932 and a second integrated circuit portion 942. The first integrated circuit portion 932 includes a first transistor set 934, input connection points 931, and output connection points 933. Similarly, the second integrated circuit portion 942 includes a second transistor set 944, input connection points 941, and output connection points 943.

The transistors of the first transistor set 934 include at least one GaN transistor, each GaN transistor having approximately the same source-to-drain distance as any other transistor in the first transistor set 934. Meanwhile, the transistors of the second transistor set 944 include at least one GaN transistor, each GaN transistor having approximately the same source-to-drain distance as any other transistor in the second transistor set 944, and having a shorter source-to-drain distance) than each transistor of the first transistor set 934. In an example, each transistor of the first transistor set 934 has a blocking voltage of approximately 80-100V and each transistor of the second transistor set 944 has a blocking voltage of approximately 30-60V. In this example, the stage 2 converter 928 can handle an input voltage of 48V and provide an output voltage of 12V.

In FIG. 9, the stage 2 converter SoC device 930 includes isolation 938, (e.g., SOI isolation or substrate well isolation) between the integrated circuit portions 932 and 942. In different embodiments of the stage 2 converter SoC device 930, the position and quantity of input and output connection points for each of the integrated circuit portions 932 and 942 may vary. As an example, if signals (e.g., $V2_{OUT}$) are to be output from the device 930 for each of the integrated circuit portions 932 and 942, then the stage 2 converter SoC device 930 may include input and output connections points for each of the integrated circuit portions 932 and 942 as shown in FIG. 9. Alternatively, if signals (e.g., $V2_{OUT}$) are not to be output from the device 930 for each of the integrated circuit portions 932 and 942, then the stage 2 converter SoC device 930 may omit some of the input and output connections points. For example, the output connection points 933 and the input connection points 941 are omitted in some embodiments (the input connection points 931 and the output connection points 943 remain to couple the stage 2 converter SoC device 930 to external components). In some embodiments, input and output connection points for each of the integrated circuit portions 932 and 942 are needed due to the isolation 938. In other embodiments, isolation 938 is omitted and/or the stage 2 converter SoC device 930 includes internal connectors between the integrated circuit portions 932 and 942.

In the multi-stage converter scenario 900, the stage 3 converter 948 includes a stage 3 converter device 950. The stage 3 converter device 950 includes an integrated circuit portion 952 with a transistor set 954, input connection points 951, and output connection points 953. The transistors of the transistor set 954 include at least one GaN transistor, each GaN transistor having approximately the same source-to-drain distance as any other transistor in the transistor set 954. In other embodiments, the transistors of the transistor set 954 are silicon transistors. Regardless of the particular transistor architecture used, the transistor set 954 includes transistors with a particular blocking voltage (e.g., 20-30V). In an example, the stage 3 converter 948 can handle an input voltage of 12V and provide an output voltage of 1V.

The stage 2 converter SoC device 930 may also be used in other DC-DC converter scenarios. For example, in one DC-DC converter scenario, the stage 2 converter SoC device 930 is used alone (e.g., to handle an input voltage of 48V and provide an output voltage of 12V). In another DC-DC converter scenario, the stage 2 converter SoC device 930 is used with a stage 1 converter. In another DC-DC converter scenario, the stage 2 converter SoC device 930 is used with a stage 3 converter.

Figure 10:
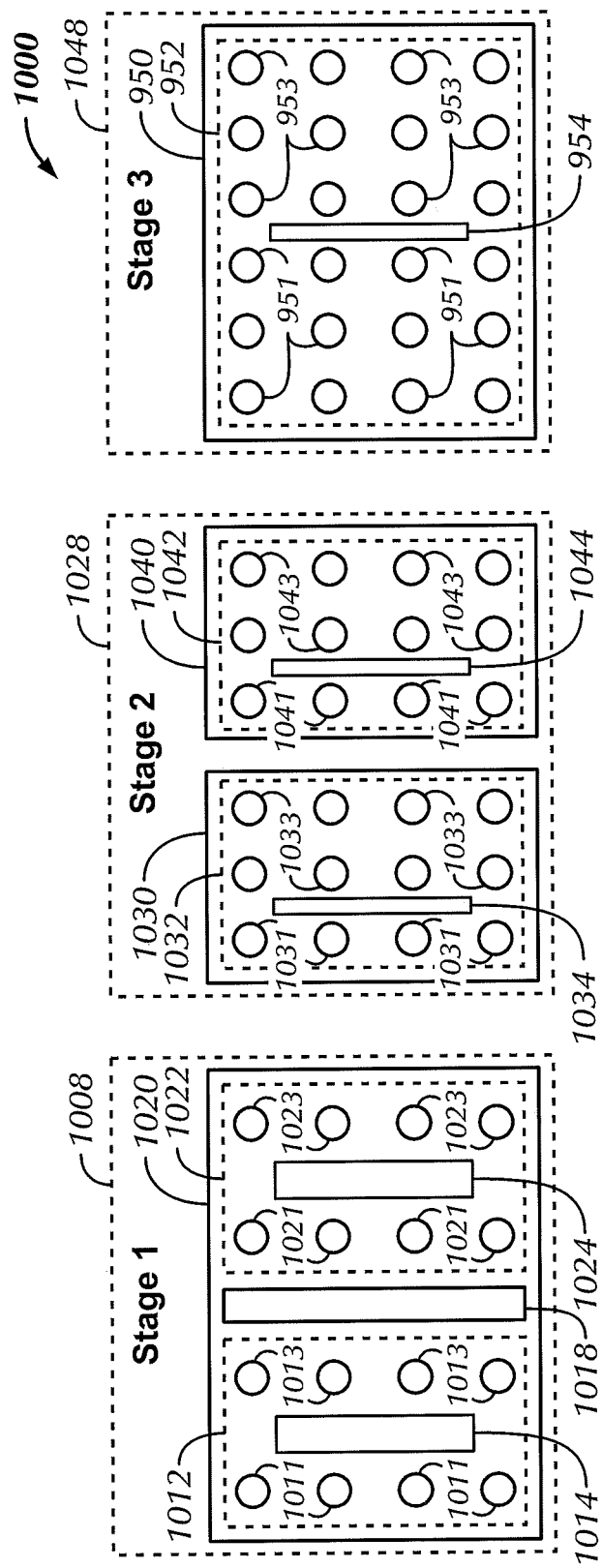

In FIG. 10, a multi-stage converter scenario 1000 with a stage 1 converter 1008, a stage 2 converter 1028, and a stage 3 converter 1048 is represented. In the scenario 1000, the stage 1 converter 1008 employs a stage 1 converter SoC device 1010 with GaN transistors with different source-to-drain distances and blocking voltages. More specifically, stage 1 converter SoC device 1010 includes a first integrated circuit portion 1012 and a second integrated circuit portion 1022. The first integrated circuit portion 1012 includes a first transistor set 1014, input connection points 1011, and output connection points 1013. Similarly, the second integrated circuit portion 1022 includes a second transistor set 1024, input connection points 1021, and output connection points 1023.

The transistors of the first transistor set 1014 include at least one GaN transistor, each GaN transistor having approximately the same source-to-drain distance as any other transistor in the first transistor set 1014. Meanwhile, the transistors of the second transistor set 1024 include at least one GaN transistor, each GaN transistor having approximately the same source-to-drain distance as any other transistor in the second transistor set 1024, and having a shorter source-to-drain distance) than each transistor of the first transistor set 1014. In an example, each transistor of the first transistor set 1014 has a blocking voltage of approximately 600-650V and each transistor of the second transistor set 1024 has a blocking voltage of approximately 100-200V. In this example, the stage 1 converter 1008 can handle an input voltage of 400V and provide an output voltage of 48V.

In FIG. 10, the stage 1 converter SoC device 1010 includes isolation 1018, (e.g., SOI isolation or substrate well isolation) between the integrated circuit portions 1012 and 1022. In different embodiments of the stage 1 converter SoC device 1010, the position and quantity of input and output connection points for each of the integrated circuit portions 1012 and 1022 may vary. As an example, if signals (e.g., $V1_{OUT}$) are to be output from the device 1010 for each of the integrated circuit portions 1012 and 1022, then the stage 1 converter SoC device 1010 may include input and output connections points for each of the integrated circuit portions 1012 and 1022 as shown in FIG. 10. Alternatively, if signals (e.g., $V1_{OUT}$) are not to be output from the device 1010 for each of the integrated circuit portions 1012 and 1022, then the stage 1 converter SoC device 1010 may omit some of the input and output connections points. For example, the output connection points 1013 and the input connection points 1021 are omitted in some embodiments (the input connection points 1011 and the output connection points 1023 remain to couple the stage 1 converter SoC device 1010 to external components). In some embodiments, input and output connection points for each of the integrated circuit portions 1012 and 1022 are needed due to isolation 1018. In other embodiments, isolation 1018 is omitted and/or the stage 1 converter SoC device 1010 includes internal connectors between the integrated circuit portions 1012 and 1022.

In the multi-stage converter scenario 1000, the stage 2 converter 1028 includes a first stage 2 converter device 1030 and a second stage 2 converter device 1040. The first stage 2 converter device 1030 includes an integrated circuit portion 1032 with a transistor set 1034, input connection points 1031 and output connection points 1033. Similarly, the second stage 1 converter device 1040 includes an integrated circuit portion 1042 with a transistor set 1044, input connection points 1041 and output connection points 1043. The various input and output connection points 1031, 1033, 1041, and 1043 enable the first stage 2 converter device 1030 and the second stage 2 converter device 1040 to couple to each other and/or other components.

In some embodiments, the transistors of the transistor set 1034 in the first stage 2 converter device 1030 include at least one GaN transistor, each GaN transistor having approximately the same source-to-drain distance as any other transistor in the transistor set 1034. In other embodiments, the transistors of the transistor set 1034 are silicon transistors. Further, in some embodiments, the transistors of the transistor set 1044 in the second stage 2 converter device 1040 include at least one GaN transistor, each GaN transistor having approximately the same source-to-drain distance as any other transistor in the transistor set 1044. In other embodiments, the transistors of the second transistor set 1044 are silicon transistors. Regardless of the particular transistor type used, the transistor set 1034 in the first stage 2 converter device 1030 includes transistors with a first blocking voltage (e.g., 80-100V) and the transistor set 1044 in the second stage 2 converter device 1040 includes transistors with a second blocking voltage (e.g., 30-60V). In an example, the stage 2 converter 1028 can handle an input voltage of 48V and provide an output voltage of 12V.

In the scenario 1000, the stage 3 converter 1048 includes the stage 3 converter device 950 as described in FIG. 9. Thus, the same discussion given for the stage 3 converter device 950 in FIG. 9 applies to the scenario 1000 of FIG. 10. In different embodiments, the stage 1 converter SoC device 1010 is used in other DC-DC converter scenarios. For example, in one DC-DC converter scenario, the stage 1 converter SoC device 1010 is used alone (e.g., to handle an input voltage of 400V and provide an output voltage of 48V). In another DC-DC converter scenario, the stage 1 converter SoC device 1010 is used with a stage 2 converter.

Figure 11:
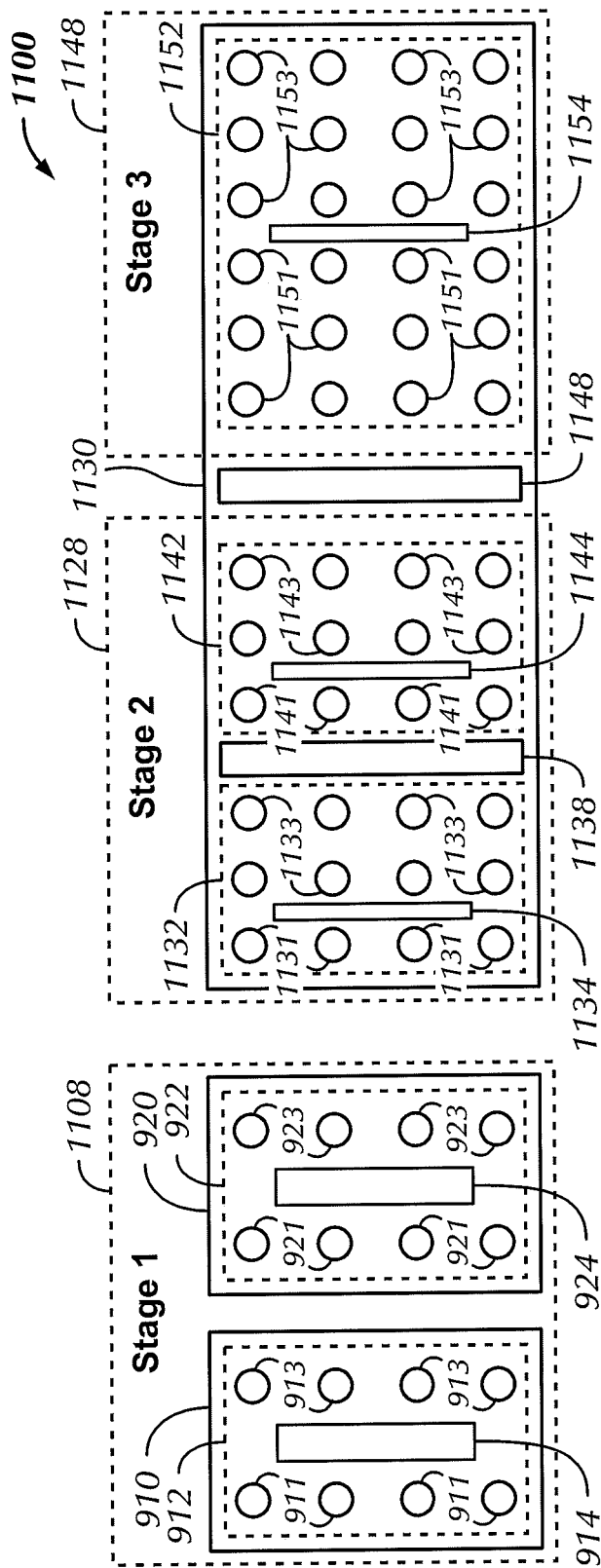

In FIG. 11, a multi-stage converter scenario 1100 with a stage 1 converter 1108, a stage 2 converter 1128, and a stage 3 converter 1148 is represented. In scenario 1100, the stage 2 converter 1128 and the stage 3 converter 1148 correspond to a multi-stage converter SoC device 1130 with GaN transistors with different source-to-drain distances and blocking voltages. Meanwhile, the stage 1 converter 1108 includes the first stage 1 converter device 910 and second stage 1 converter device 920 described in FIG. 9. Accordingly, the same discussion as given in FIG. 9 for the first stage 1 converter device 910 and second stage 1 converter device 920 applies in the scenario 1100 of FIG. 11.

In scenario 1100, the multi-stage converter SoC device 1130 includes the stage 2 converter 1128 and the stage 3 converter 1148. The stage 2 converter 1128 includes a first integrated circuit portion 1132 with a first transistor set 1134, input connection points 1131, and output connection points 1133. The transistors of the first transistor set 1134 include at least one GaN transistor, each GaN transistor having approximately the same source-to-drain distance as any other transistor in the first transistor set 1134. The stage 2 converter 1128 also includes a second integrated circuit portion 1142 with a second transistor set 1144, input connection points 1141, and output connection points 1143. The transistors of the second transistor set 1144 include at least one GaN transistor, each GaN transistor having approximately the same source-to-drain distance as any other transistor in the second transistor set 1144, and having a shorter source-to-drain distance than each transistor of the first transistor set 1134. In one example, each transistor of the first transistor set 1134 has a blocking voltage of approximately 80-100V and each transistor of the second transistor set 1144 has a blocking voltage of approximately 30-60V. In this example, the stage 2 converter 1128 can handle an input voltage of 48V and provide an output voltage of 12V.

The stage 3 converter 1148 includes a third integrated circuit portion 1152 with a third transistor set 1154, input connection points 1151, and output connection points 1153. The transistors of the third transistor set 1154 include at least one GaN transistor, each GaN transistor having approximately the same source-to-drain distance as any other transistor in the third transistor set 1154, and having a shorter source-to-drain distance than each transistor of the transistor sets 1134 and 1144. In an example, each transistor of the third transistor set 1154 has a blocking voltage of 20-30V. In this example, the stage 3 converter 1148 can handle an input voltage of 12V and provide an output voltage of 1V.

In FIG. 11, the multi-stage converter SoC device 1130 includes isolation 1138 and 1148 (e.g., SOI isolation or substrate well isolation) between the different integrated circuit portions. More specifically, isolation 1138 is between the first and second integrated circuit portions 1132 and 1142. Also, isolation 1148 is between the second and third integrated circuit portions 1142 and 1152.

In different embodiments of the multi-stage converter SoC device 1130, the position and quantity of input and output connection points for each of the integrated circuit portions 1132, 1142, and 1152 may vary. As an example, if signals (e.g., $V2_{OUT}$, $V3_{OUT}$) are to be output from the device 1130 at each of the integrated circuit portions 1132, 1142, and 1152, then the multi-stage converter SoC device 1130 may include input and output connections points for each integrated circuit portions 1132, 1142, and 1152 as shown in FIG. 11. Alternatively, if signals (e.g., $V2_{OUT}$, $V3_{OUT}$) are not output from the device 1130 for each of the integrated circuit portions 1132, 1142, and 1152, then the multi-stage converter SoC device 1130 may omit some of the input and output connections points. For example, the output connection points 1133, 1143 and the input connection points 1141, 1151 are omitted in some embodiments (only the input connection points 1131 and the output connections points 1153 are used to connect the multi-stage converter SoC device 1130 to external components). Other variations are possible. In some embodiments, input and output connection points for each of the integrated circuit portions 1132, 1142, and 1152 are needed due to the isolation 1138 and 1148. In other embodiments, one or more of isolation 1138 and 1148 is omitted and/or the multi-stage converter SoC device 1130 includes internal connectors between adjacent integrated circuit portions.

In some embodiments, the multi-stage converter SoC device 1130 also includes control circuitry (e.g., gate drive components) and/or passive components. Such control circuitry generates gate driver signals for the transistor sets 1134, 1144, and 1154. Meanwhile, the passive components (e.g., resistors, capacitors, and inductors) included with the multi-stage converter SoC device 1130 may vary according to the DC-DC converter topologies selected for stages 1128 and 1148 of the multi-stage converter SoC device 1130. In some embodiments, the multi-stage converter SoC device 1130 is used alone (e.g., without a stage 1 converter).

Figure 12:
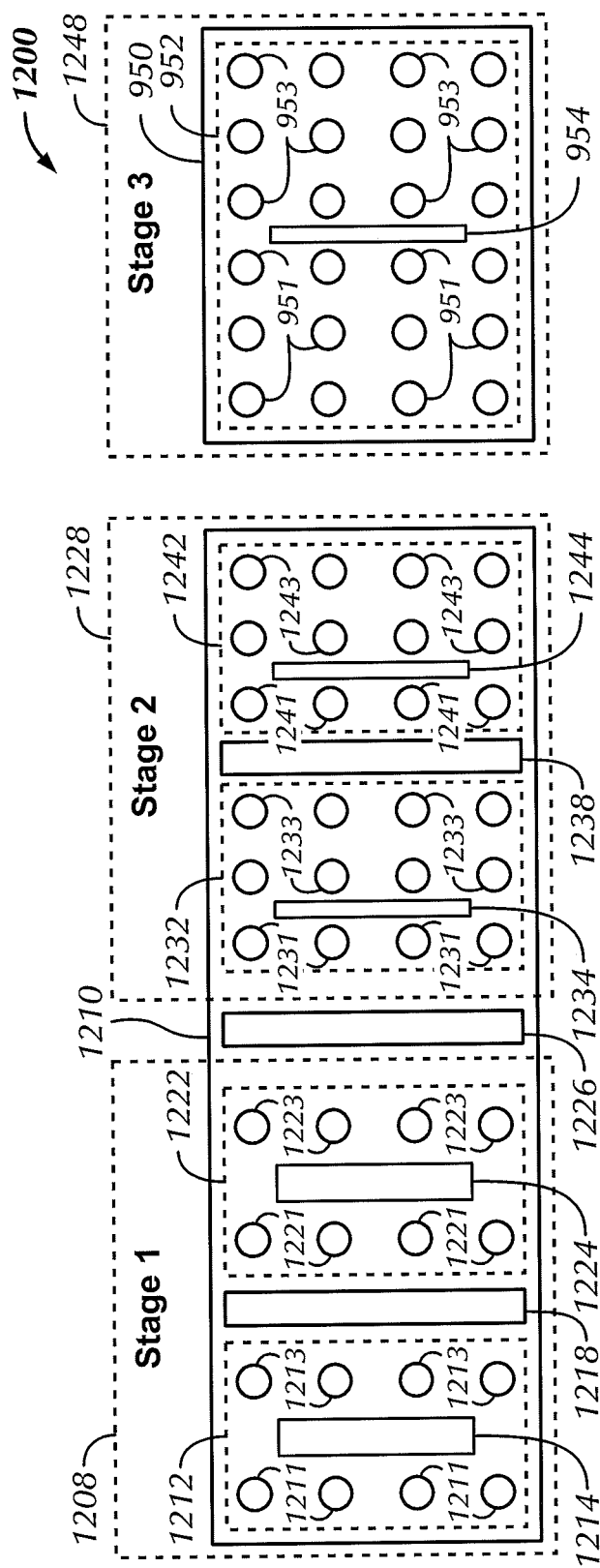

In FIG. 12, a multi-stage converter scenario 1200 with a stage 1 converter 1208, a stage 2 converter 1228, and a stage 3 converter 1248 is represented. In scenario 1200, the stage 1 converter 1208 and the stage 2 converter 1228 correspond to a multi-stage converter SoC device 1210 with GaN transistors with different source-to-drain distances and blocking voltages. Meanwhile, the stage 3 converter 1248 includes the stage 3 converter device 950 described in FIG. 9. Accordingly, the same discussion as given in FIG. 9 for the stage 3 converter device 950 applies in the scenario 1200 of FIG. 12.

In scenario 1200, the multi-stage converter SoC device 1210 includes the stage 1 converter 1208 and the stage 2 converter 1228. The stage 1 converter 1208 includes a first integrated circuit portion 1212 with a first transistor set 1214, input connection points 1211, and output connection points 1213. The transistors of the first transistor set 1214 include at least one GaN transistor, each GaN transistor having approximately the same source-to-drain distance as any other transistor in the first transistor set 1214. The stage 1 converter 1208 also includes a second integrated circuit portion 1222 with a second transistor set 1224, input connection points 1221, and output connection points 1223. The transistors of the second transistor set 1224 include at least one GaN transistor, each GaN transistor having approximately the same source-to-drain distance as any other transistor in the second transistor set 1224, and having a shorter source-to-drain distance than each transistor of the first transistor set 1214. In an example, each transistor of the first transistor set 1214 has a blocking voltage of approximately 600-650V and each transistor of the second transistor set 1224 has a blocking voltage of approximately 100-200V. In this example, the stage 1 converter 1208 can handle an input voltage of 400V and provide an output voltage of 48V.

The stage 2 converter 1228 includes a third integrated circuit portion 1232 with a third transistor set 1234, input connection points 1231, and output connection points 1233. The transistors of the third transistor set 1234 include at least one GaN transistor, each GaN transistor having approximately the same source-to-drain distance as any other transistor in the third transistor set 1234, and having a shorter source-to-drain distance than each transistor of the transistor sets 1214 and 1224. In an example, each transistor of the third transistor set 1234 has a blocking voltage of 80-100V.

The stage 2 converter 1228 also includes a fourth integrated circuit portion 1242 with a fourth transistor set 1244, input connection points 1241, and output connection points 1243. The transistors of the fourth transistor set 1244 include at least one GaN transistor, each GaN transistor having approximately the same source-to-drain distance as any other transistor in the third transistor set 1244, and having a shorter source-to-drain distance than each transistor of the transistor sets 1214, 1224, and 1234. In an example, each transistor of the fourth transistor set 1244 has a blocking voltage of 30-60V. In this example, the stage 2 converter 1228 can handle an input voltage of 48V and provide an output voltage of 12V.

In FIG. 12, the multi-stage converter SoC device 1210 includes isolation 1218, 1226, and 1238 (e.g., SOI isolation or substrate well isolation) between the different integrated circuit portions. More specifically, isolation 1218 is between the first and second integrated circuit portions 1212 and 1222. Also, isolation 1226 is between the second and third integrated circuit portions 1222 and 1232. Finally, isolation 1238 is between the third and fourth integrated circuit portions 1232 and 1242.

In different embodiments of the multi-stage converter SoC device 1210, the position and quantity of input and output connection points for each of the integrated circuit portions 1212, 1222, 1232, and 1242 may vary. As an example, if signals (e.g., $V1_{OUT}$, $V2_{OUT}$) are to be output from the device 1210 at each of the integrated circuit portions 1212, 1222, 1232, and 1242, then the multi-stage converter SoC device 1210 may include input and output connections points for each integrated circuit portions 1212, 1222, 1232, and 1242 as shown in FIG. 12. Alternatively, if signals (e.g., $V1_{OUT}$, $V2_{OUT}$) are not output from the device 1210 for each of the integrated circuit portions 1212, 1222, 1232, and 1242, then the multi-stage converter SoC device 1210 may omit some of the input and output connections points. For example, the output connection points 1213, 1223, and 1233, and the input connection points 1221, 1231, and 1241 are omitted in some embodiments (only the input connection points 1211 and the output connections points 1243 are used to connect the multi-stage converter SoC device 1210 to external components). Other variations are possible. In some embodiments, input and output connection points for each of the integrated circuit portions 1212, 1222, 1232, and 1242, are needed due to isolation 1218, 1226, 1238. In other embodiments, one or more of isolation 1218, 1226, 1238 is omitted and/or the multi-stage converter SoC device 1210 includes internal connectors between adjacent integrated circuit portions.

In some embodiments, the multi-stage converter SoC device 1210 also includes control circuitry (e.g., gate drive components) and/or passive components. Such control circuitry generates gate driver signals for the transistor sets 1214, 1224, 1234, 1244. Meanwhile, the passive components (e.g., resistors, capacitors, and inductors) included with the multi-stage converter SoC device 1210 may vary according to the DC-DC converter topologies selected for stages 1208 and 1228 of the multi-stage converter SoC device 1210.

In scenario 1200, the stage 3 converter 1248 includes the stage 3 converter device 950 as described in FIG. 9. Thus, the same discussion given for the stage 3 converter device 950 in FIG. 9 applies to the scenario 1200 of FIG. 12. In different embodiments, the multi-stage converter SoC device 1210 is used in other DC-DC converter scenarios. For example, in one DC-DC converter scenario, the multi-stage converter SoC device 1210 is used alone (e.g., to handle an input voltage of 400V and provide an output voltage of 12V).

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An integrated DC-DC converter device, comprising:
a plurality of GaN transistor sets formed on a substrate, wherein a first set of the plurality of GaN transistor sets includes transistors with a first drain-to-source distance, and wherein a second set of the plurality of GaN transistor sets includes transistors with a second drain-to-source distance that is greater than the first drain-to-source distance; and
substrate well isolation between each of the plurality of GaN transistor sets.

2. The integrated DC-DC converter device of claim 1, wherein a third set of the plurality of GaN transistor sets includes transistors with a third drain-to-source distance that is greater than the second drain-to-source distance.

3. The integrated DC-DC converter device of claim 2, wherein a fourth set of the plurality of GaN transistor sets includes transistors with a fourth drain-to-source distance that is greater than the third drain-to-source distance.

4. The integrated DC-DC converter device of claim 3, wherein a fifth set of the plurality of GaN transistor sets includes transistors with a fifth drain-to-source distance that is greater than the fourth drain-to-source distance.

5. The integrated DC-DC converter device of claim 1, wherein the plurality of GaN transistor sets are associated with a single stage of a multi-stage DC-DC converter.

6. The integrated DC-DC converter device of claim 1, wherein the plurality of GaN transistor sets are associated with multiple stages of a multi-stage DC-DC converter.

7. The integrated DC-DC converter device of claim 1, further comprising gate drive components for a single stage of a multi-stage DC-DC converter.

8. The integrated DC-DC converter device of claim 1, further comprising gate drive components for multiple stages of a multi-stage DC-DC converter.

9. The integrated DC-DC converter device of claim 1, further comprising passive components for a single stage of a multi-stage DC-DC converter.

10. The integrated DC-DC converter device of claim 1, further comprising passive components for multiple stages of a multi-stage DC-DC converter.

11. An integrated DC-DC converter device, comprising:
a plurality of GaN transistor sets formed on a substrate, wherein a first set of the plurality of GaN transistor sets includes transistors with a first drain-to-source distance, and wherein a second set of the plurality of GaN transistor sets includes transistors with a second drain-to-source distance that is greater than the first drain-to-source distance; and
silicon on insulator (SOI) isolation between each of the plurality of GaN transistor sets.

12. The integrated DC-DC converter device of claim 11, wherein a third set of the plurality of GaN transistor sets includes transistors with a third drain-to-source distance that is greater than the second drain-to-source distance.

13. The integrated DC-DC converter device of claim 12, wherein a fourth set of the plurality of GaN transistor sets includes transistors with a fourth drain-to-source distance that is greater than the third drain-to-source distance.

14. The integrated DC-DC converter device of claim 13, wherein a fifth set of the plurality of GaN transistor sets includes transistors with a fifth drain-to-source distance that is greater than the fourth drain-to-source distance.

15. The integrated DC-DC converter device of claim 11, wherein the plurality of GaN transistor sets are associated with a single stage of a multi-stage DC-DC converter.

16. The integrated DC-DC converter device of claim 11, wherein the plurality of GaN transistor sets are associated with multiple stages of a multi-stage DC-DC converter.

17. The integrated DC-DC converter device of claim 11, further comprising gate drive components for a single stage of a multi-stage DC-DC converter.

18. The integrated DC-DC converter device of claim 11, further comprising gate drive components for multiple stages of a multi-stage DC-DC converter.

19. The integrated DC-DC converter device of claim 11, further comprising passive components for a single stage of a multi-stage DC-DC converter.

20. The integrated DC-DC converter device of claim 11, further comprising passive components for multiple stages of a multi-stage DC-DC converter.

* * * * *